United States Patent
Thome et al.

(10) Patent No.: US 8,456,220 B2
(45) Date of Patent: Jun. 4, 2013

(54) MANAGING A TEMPERATURE OF A SEMICONDUCTOR SWITCHING ELEMENT

(75) Inventors: Christian Thome, Freiburg (DE); Michael Glueck, Freiburg (DE)

(73) Assignee: HUETTINGER Elektronik GmbH + Co. KG, Freiburg (DE)

(*) Notice: Subject to any disclaimer, the term of this patent is extended or adjusted under 35 U.S.C. 154(b) by 0 days.

(21) Appl. No.: 13/524,864

(22) Filed: Jun. 15, 2012

(65) Prior Publication Data

US 2012/0306564 A1 Dec. 6, 2012

Related U.S. Application Data

(63) Continuation of application No. PCT/EP2010/069356, filed on Dec. 10, 2010.

(30) Foreign Application Priority Data

Dec. 18, 2009 (DE) .......................... 10 2009 054 987

(51) Int. Cl.
*H01L 35/00* (2006.01)
(52) U.S. Cl.
USPC .......................................... 327/513; 327/419
(58) Field of Classification Search
USPC ................ 327/419, 423, 427, 434, 478, 512, 327/513, 574, 581, 588
See application file for complete search history.

(56) References Cited

U.S. PATENT DOCUMENTS

| | | | |
|---|---|---|---|
| 5,068,777 A | 11/1991 | Ito | |
| 6,061,221 A * | 5/2000 | Tihanyi | 361/103 |
| 7,782,100 B2 * | 8/2010 | Steuber et al. | 327/110 |
| 7,887,235 B2 * | 2/2011 | Campos et al. | 374/178 |

FOREIGN PATENT DOCUMENTS

| | | |
|---|---|---|
| DE | 4107674 A1 | 9/1992 |
| DE | 10058374 A1 | 6/2002 |
| EP | 1601015 A1 | 11/2005 |
| EP | 2037561 A1 | 3/2009 |
| JP | 2004327123 A | 11/2004 |
| WO | 9714177 A1 | 4/1997 |

OTHER PUBLICATIONS

Translation of the International Preliminary Report on Patentability from corresponding PCT Application No. PCT/EP2010/069356, mailed Jul. 31, 2012, 9 pages.
Weiss, Robert, "Mikrocontroller XC 16x", pCNEWS-81, 2003, heft 81, pp. 40-41.

* cited by examiner

*Primary Examiner* — Jeffrey Zweizig
(74) *Attorney, Agent, or Firm* — Fish & Richardson P.C.

(57) ABSTRACT

In a method for operating a plasma installation, an induction heating installation or a laser excitation installation in a pulsed power output operation, includes controlling at least one semiconductor switching element to produce a power loss in the at least one semiconductor switching element during a pulse pause time period in a pulse pause operation during which no power suitable for the ignition or the operation of the plasma process, the induction heating process, or the laser excitation process is produced at a power output of a power generator by the at least one semiconductor switching element of the power generator, and such that a reduction of a temperature of the at least one semiconductor switching element by more than a predetermined value is prevented.

17 Claims, 4 Drawing Sheets

MANAGING A TEMPERATURE OF A SEMICONDUCTOR SWITCHING ELEMENT

CROSS REFERENCE TO RELATED APPLICATIONS

This application is a continuation of, and claims priority under 35 U.S.C. §120 to, PCT Application No. PCT/EP2010/069356, filed on Dec. 10, 2010, which claims priority to German Application No. DE 10 2009 054 987.0, filed on Dec. 18, 2009. The contents of both of these priority applications are hereby incorporated by reference in their entirety.

TECHNICAL FIELD

The invention relates to methods for operating a plasma installation, an induction heating installation, or a laser excitation installation.

BACKGROUND

In order to produce alternating current power, in particular high-frequency power, for industrial processes, such as induction heating or plasma excitation or excitation of gas lasers, alternating current power production devices having amplifier tubes are often still used for high power levels. One reason for this is the robust nature of the amplifier tubes with respect to rapid load changes. However, alternating current power production devices having amplifier tubes have a poor level of efficiency, and amplifier tubes are subject to wear. Consequently, attempts have increasingly been made to replace these alternating current power production devices with ones that function with semiconductor switching elements. These may, for example, be transistors. Power levels of up to approx. 500 W per transistor can be produced with transistors that are currently available. However, levels of several kilowatts up to megawatts are required. In order to produce such power levels, a plurality of transistors must be connected together to form transistor modules that are installed in power convertor units. In addition, a plurality of power convertor units must be connected together to form alternating current power production devices. Consequently, the number of transistors in an alternating current power production device increases by at least two transistors with each kilowatt required. Consequently, the requirements for the reliability of the individual transistors increase exponentially, since each transistor that fails can lead to the shutdown of an entire alternating current power production device.

In industrial processes, alternating current power production devices are often operated in a pulsed manner, sometimes with very different pulse frequencies of from every second up to a few µs. The transistors are often operated with high frequencies of above 3 MHz. A modulation of the output power is also a known method in industrial processes. In this instance, for example, in induction heating processes, the output power is changed when specific temperatures have been reached in the workpiece and are then intended only to be maintained or changed slightly. When processing workpieces with lasers, for example, the power convertors must bridge relatively long downtimes or standby times in which no power is required, such as when changing workpieces to be processed.

Semiconductor switching elements, such as, for example, transistors, IGBTs, MOSFETS, or transistor modules constructed therefrom, that are operated with high levels of current to produce high levels of power, for example, greater than 100 W, often have a tendency for premature failure, particularly when the operation of the semiconductor switching elements is carried out with pulsed power changes. This is explained in particular by two phenomena. One phenomenon is the different thermal expansion coefficients of the materials used in the semiconductor switching elements (such as, for example, substrate, semiconductor layer, bond wires). Even if all the components of the semiconductor switching element were to heat to a temperature in a uniform manner, the differing thermal expansion of the materials leads to internal mechanical tensions, which, over time and with the expansion movement owing to temperature changes, lead to breakage and failure. Another phenomenon is the differing temperature distribution in particular with intensively cooled components. When producing power of more than 100 W using semiconductor switching elements, it is generally indispensable to cool the semiconductor switching elements in a forced manner, that is to say, for example, by means of cooling members with forced air flow or by means of fluid cooling. A temperature gradient is produced in this instance, for example, from the semiconductor layer of the semiconductor switching elements to the cooling plate. This means that an additional load is also added to the loads described above owing to different temperature distribution. In this instance, there is also still no uniform temperature distribution over the area of the semiconductor switching elements, which also leads to mechanical tensions.

Semiconductor switching elements fail when there are temperature fluctuations. During power production operation, the semiconductor switching elements become warm and the phenomena described above occur. However, between two power operating phases, there is cooling, which leads to further mechanical tensions. A constant change between power operation and pausing between two power operations therefore constantly leads to temperature-related mechanical tensions and movements.

SUMMARY

In general, this invention relates to operating a plasma installation, an induction heating installation, or a laser excitation installation using semiconductor switching elements in a pulsed power output operation such that the service-life of the semiconductor switching elements may be increased.

One aspect of the invention achieves this by a method for operating a plasma installation, an induction heating installation or a laser excitation installation in a pulsed power output operation, a first power $P_{OUT1.1}$ being produced in a power output time period $\Delta T_1$ and being discharged at a power output of a power generator for supplying power to a plasma process, an induction heating process, or a laser excitation process, and no power $P_{OUT2.1}$ suitable for the ignition or the operation of a plasma process, an induction process, or a laser excitation process being output in a pulse pause time period $\Delta T_2$ at the power output of the power generator by at least one semiconductor switching element of the power generator being controlled, a first power loss $P_{V1}$ being produced in the at least one semiconductor switching element during the power output time period $\Delta T_1$ at the same time as the first power $P_{OUT1.1}$ is being produced, and a second power loss $P_{V2}$ being produced during the pulse pause time period $\Delta T_2$ in the at least one semiconductor switching element, and the power losses $P_{V1}$, $P_{V2}$ produced being converted into heat, a reduction of the temperature of the semiconductor switching element by more than a predetermined value being prevented by means of appropriate control of the semiconductor switching element, and the power output operation and pulse pause operation continuously alternating.

Therefore, there is always a deliberate increase in the power loss in the semiconductor switching elements when no power is provided or such a low level of power is provided at the output that no plasma process can be ignited or no plasma process, induction heating process, or laser excitation process can be operated. In conventional manner, when a first power is produced, a first power loss in the semiconductor switching element would be converted into heat. If it is assumed that the efficiency level does not change, when a second lower power is produced a proportionally lower power loss is converted into heat. This is particularly serious when no power is produced. In accordance with conventional methods, in this case no power loss is converted into heat and the semiconductor switching element cools. During the next power increase, for example, to the first power, it would heat up again. This results in damaging loads for the semiconductor switching element owing to mechanical thermal expansion tensions. With the method described in this instance, it is possible, in the semiconductor switching elements, for the power loss and consequently the heat development produced during the pulse pause time period to be increased in a selective manner. Consequently, the temperature difference between the power changes decreases and has a less serious effect on the sensitive semiconductor switching elements. This method conflicts with the aim of maximizing the efficiency and minimizing the power loss. However, a reduction of the failure rates of the semiconductor switching elements has been found to be more user-friendly and cost-effective than a further reduction of the power loss. It is further possible to undertake additional successful steps towards the aim of reducing the power loss by further attempts being made to reduce the first power loss $P_{V1}$. Semiconductor switching elements may be transistors, such as, for example, IGBTs or MOSFETs or diodes with control inputs, which can be brought from a conductive to a blocking state. Optionally, they may also be brought at least temporarily into a partially conductive state.

During a pulse pause, when $P_{OUT2.1}$ is equal to zero watt, a second power loss $P_{V2}$ greater than zero is preferably also produced and converted into heat in the semiconductor switching elements.

The semiconductor switching element or the semiconductor switching elements may be controlled by means of a control signal from a control circuit.

Industrial processes can be operated in a pulsed power output operation, a specific power level being requested from the output during a first time range and no power actually being requested during a second time range, that is to say, when the workpiece to be processed, for example, in the case of a plasma, a wafer, a compact disc, an FPD, etc., in the case of an induction heating operation, the workpiece to be heated, or, in the case of a laser, a metal sheet, is changed or subjected to another process. The first and second range are repeated continuously. This is not necessarily carried out with a fixed frequency or with fixed pulse pauses, but can be predicted by a control system. In accordance with this description, temperature fluctuations can be reduced on particularly sensitive components. In particular, the sensitive components can be prevented from cooling excessively during the pulse pauses, that is to say, during those times in which no output power is required. It is first and foremost not a matter of not exceeding a specific maximum temperature, but instead one of reducing a temperature decrease on particularly sensitive components during the pulse pause time period.

In some industrial processes, however, it may be advantageous for the power output time period and the pulse pause time period to alternate with a frequency fp predetermined by the plasma installation, induction heating installation or laser excitation installation.

Embodiments can be used in principle, both, for industrial processes that are supplied with an alternating current power and for industrial processes that are supplied with direct current power. If the industrial process requires alternating current power, it is advantageous for alternating current power to be produced at a frequency fn>fp during the power output time period. During the power output time period, alternating power is accordingly supplied. At the output of a power generator in which the semiconductor switching elements are arranged, a pulsed alternating current power is accordingly output.

In this instance, the frequency fp may be in the range from 0.01 Hz to 50 kHZ.

The first power loss $P_{V1}$ can be established from a predetermined or a measured value for the first power $P_{OUT1.1}$, the second power loss $P_{V2}$ to be adjusted can be determined based on the established first power loss $P_{V1}$ and the at least one semiconductor switching element can be controlled to produce the second power loss $P_{V2}$. Consequently, the first power loss $P_{V1}$ does not have to be measured. That would be very complex and would have to be carried out very quickly, that is to say, also in the vicinity of the semiconductor switching element. $P_{V1}$ can be determined using the control circuit that controls the semiconductor switching elements. The control circuit can be configured to adjust the first power when it receives a predetermined desired value for a first power $P_{OUT1.1}$. It can be configured to determine the associated power loss $P_{V1}$. To this end, it may, for example, access data tables or calculate this with reference to a formula or determine it with reference to a stored function. For a second predetermined power $P_{OUT2.1}$, the second power loss $P_{V2}$ can be determined using the control circuit with reference to the instruction $P_{V2} > P_{V1} * (P_{OUT2.1})$ and the semiconductor switching elements can be controlled accordingly, that is to say, in such a manner that $P_{V2}$ and $P_{OUT2.1}$ are produced. The control circuit can access all the information in order to adjust $P_{V1}$ even without a variable that relates to $P_{V2}$ having to be measured.

The method may be distinguished in that the first power loss $P_{V1}$ is determined by a value associated with the first power $P_{OUT1.1}$ being read from a data store. The control circuit may be distinguished in that it processes digital signals or digital and analogue signals, processes data or carries out calculations and thus generates control signals that control the semiconductor switching elements.

The second power loss $P_{V2}$ can be adjusted in accordance with one or more of the following values:
  duration of the power output time period
  duration of the pulse pause time period
  progression in time of the power
  progression in time of the power loss in the semiconductor switching elements
  an established temperature or a temperature curve
  an established voltage value or voltage curve
  an established current value or current curve
  time derivative of the curve of the alternating current power, the power loss in the semiconductor switching elements, the temperature curve, the voltage curve or the current curve.

For the adjustment of the second power loss $P_{V2}$, it is possible to consider, for example, the ambient temperature, for example, inside a housing, in the alternating current power production device, the temperature of a cooling device, for example, the cooling plate or a cooling medium, or the temperature of the semiconductor switching element. As a temperature of the semiconductor switching element, it is possible to use a temperature in the immediate vicinity, that is to say, for example, directly on the semiconductor switching element, or at a predetermined distance, that is to say, for example, on the housing of the semiconductor switching element. These temperatures can be measured and in combination with the duration of the first or second time range can also be used for the adjustment of the second power loss $P_{V2}$. In the case of modulated signals, the progression in time of the power, in particular an alternating current power, of a specific voltage on the semiconductor switching element or at the output of a power convertor unit or, for example, the current through the semiconductor switching element, can be taken into account for the adjustment of the second power loss $P_{V2}$. All the mentioned data can be saved in a store that the control circuit can access to determine the second power loss $P_{V2}$. The data can be saved in a cyclical manner in a ring store and can be overwritten after a specific data quantity. The control circuit may then always have access to the most current data, which are significant in the adjustment of the second power loss $P_{V2}$. All these values can be used individually or in combination with each other or with the previously mentioned values for $P_{OUT1.1}$, $P_{OUT2.1}$ or in weighted combination or with their time derivative for the assessment.

The second power loss $P_{V2}$ may be the same size as the first power loss $P_{V1}$. This is the situation generally sought since it can then be assumed that there is no temperature difference at all in the semiconductor switching elements.

The second power loss $P_{V2}$ may be the same size as the first power loss $P_{V1}$+50% or ±30% or ±20%. In order to reach the target $P_{V2}=P_{V1}$, it is sometimes necessary to make huge efforts. Consequently, it is advantageous in some circumstances to set greater limits for the adjustment. This can also be made dependent on the ambient temperature or the temperature of a cooling medium since the risk of failure for the semiconductor switching elements may be higher with the same temperature change when the absolute temperature is higher. Controlling the semiconductor switching elements in such a manner that the second power loss $P_{V2}$ is higher than the first power loss $P_{V1}$ is not really advantageous, since no advantage can be established in respect of reliability and the increased power loss is produced in a disadvantageous manner. However, if this is carried out within specific limits and, owing to imprecision, in order at the same time to keep the efforts low when determining the power loss, this may nonetheless be advantageous.

According to a variant of the method, there may be provision for the at least one semiconductor switching element to be controlled during the power output time period $\Delta T_1$ several times both into a conductive state, in which it has a switching resistance $R_{on}$, and into a blocking state, in which it has a blocking resistance $R_{off}$ and, during the pulse pause time period $\Delta T_2$, to be switched at least temporarily into a partially conductive state, in which it has a transition resistance $R_V$, the resistances being given by: $R_{on} < R_V$ and $R_V < R_{off}$. Conventionally, attempts are made to switch the semiconductor switching elements back and forth if possible from the conductive state into the non-conductive state and to keep the partially conductive state, which is located therebetween, as short as possible and to ensure that the smallest possible amount of power loss is produced in the semiconductor switching elements since, when $R_{on}$ is very low, only a very small voltage will drop over the semiconductor switching elements and the power loss will be low and, when $R_{off}$ is very high, then only a small current will flow over the semiconductor switching elements and the power loss will also be low. However, in order to achieve an appreciable power loss, as described in the method, it may be advantageous deliberately to bring and retain the semiconductor switching elements at least temporarily in a partially conductive state. In this state, the power loss may be adjusted very precisely, when the current I or the voltage U are known, and the resistance $R_V$ is adjusted accordingly in such a manner that the power loss $P_{V2}=U^2/R_V$ or $P_{V2}=I^2*R_V$ is adjusted.

According to a variant of the method, there may be provision for the at least one semiconductor switching element to be controlled during the pulse pause time period $\Delta T_2$ in such a manner that the second power $P_{OUT2.1}$ is equal to zero and the first power loss $P_{V1}$ and the second power loss $P_{V2}$ are different by no more than the factor of two. This represents a very good compromise between justifiable complexity and sufficient reduction of the risk of failure of the semiconductor switching elements in a typical application.

There may further be provision for the at least one semiconductor switching element to be controlled during the power output time period $\Delta T_1$ for a switching-on time range $\Delta T_{on1}$ into a conductive state and for a switching-off time range $\Delta T_{off1}$ into a blocking state, and to be controlled during the pulse pause time period $\Delta T_2$ for a switching-on time range $\Delta T_{on2}$ into a conductive state and for a switching-off time range $\Delta T_{off2}$ into a blocking state, and for $\Delta T_{on2}$ to be smaller than $\Delta T_{on1}$. $\Delta T_{on2}$ may be selected to be so small that the semiconductor switching elements do guide current but produce no power at the output. This is technically possible since, when switching on many semiconductor switching elements, charge carriers must first be redistributed within the semiconductor layers, for example, before a current flow becomes evident at the output of the semiconductor switching element or leads to a voltage change at the output. This current can bring about a power loss in the semiconductor switching elements. This can be used for the adjustment of $P_{V2}$. However, $\Delta T_{on2}$ can also be selected to be longer, but still so small that the short power pulses produced in this manner are not allowed through at the output of the semiconductor switching element of subsequent output circuits, such as, for example, filter elements, or are powerfully damped. If a short pulse $\Delta T_{on2}$ is not sufficient to produce the desired power loss $P_{V2}$, a plurality of these pulses can be produced with predetermined or variable frequency.

There may be provision for an additional first power $P_{OUT1.2}$ to be produced during the power output time period $\Delta T_1$ and for an additional second power $P_{OUT2.2}$ to be produced during a pulse pause time period $\Delta T_2$, by at least one additional semiconductor switching element being controlled. The first and additional first power can each be produced in their own power convertor unit. The powers produced by a plurality of power convertor units can be coupled together to form an output power. This can be supplied to subsequent processes. Such a method has several advantages. Firstly, higher output powers can be achieved, in particular when not only two but also additional powers are produced in power convertor units and connected together. However, reliability is extremely important particularly in this instance since a failure of a semiconductor switching element may lead to the failure of the entire power production device. Furthermore, such a method affords the advantage that, for example, the semiconductor switching elements can be controlled in such a manner that they produce a lower output power (for example, $P_{OUT2.1}$, $P_{OUT2.2}$) and, at the same time, a power loss that has not been reduced to the same extent (for example, $P_{V2}$), which achieves the advantages described herein with a comparatively low amount of components. This works because the two semiconductor switching elements can be controlled in such a manner for the production of the lower output power that they mutually load each other. Furthermore, being connected together via a power coupler offers increased malfunction resistance with respect to reflected powers and the semiconductor switching elements are consequently additionally protected.

The at least one semiconductor switching element and the at least one additional semiconductor switching element can each be controlled in accordance with their own control procedure, the control procedures differing. In particular, the control procedures may be the same during the production of the power $P_{OUT1.1}$ and $P_{OUT1.2}$, and different during the production of the power $P_{OUT2.1}$ and $P_{OUT2.2}$. It is thus possible to achieve particularly low-loss symmetrical control with the same control procedure and, with a different control procedure, to achieve non-symmetrical control that deliberately involves greater loss. Possible control procedures may be, for example, pulse width control, phase displacement or frequency variation.

The method may be distinguished in that the semiconductor switching elements are controlled when producing the power $P_{OUT1.1}$ and $P_{OUT1.2}$ in accordance with another first control procedure and when producing the power $P_{OUT2.1}$ and $P_{OUT2.2}$ in accordance with an additional second control procedure, the control procedures differing. The additional first control procedure may thus be a control procedure that produces particularly low levels of loss and the additional second control procedure may produce specific and controllable losses in the semiconductor switching elements. Possible control procedures may also in this instance be, for example, pulse width control, phase shift or frequency variation.

The method may be distinguished in that a first phase relationship between the first power $P_{OUT1.1}$ and the first additional power $P_{OUT1.2}$ is adjusted and a second phase relationship, which differs from the first, between the second power $P_{OUT2.1}$ and the second additional power $P_{OUT2.2}$ is adjusted. With such a method, the second power loss $P_{V2}$ can be produced in a particularly precise and accurately reproducible manner. Although it requires considerable complexity in terms of development and calibration, it can be used in a very universal and reliable manner.

A variable related to the first power $P_{OUT1.1}$ can be detected by a measuring means and adjusted to a desired value. This may be, for example, the output power, the output voltage or the output current of the power convertor.

Another aspect of the invention includes assessing whether the methods described herein should be used, in particular whether a power loss should deliberately be produced, based on one of the following values and/or a combination of a plurality of the following values:
- duration of the power output time period $\Delta T_1$
- duration of the pulse pause time period $\Delta T_2$
- progression in time of the power
- progression in time of the power loss in the semiconductor switching elements
- an established temperature or a temperature curve
- an established voltage value or voltage curve
- an established current value or current curve
- time derivative of the curve of the power, the power loss in the semiconductor switching elements, the temperature curve, the voltage curve or the current curve. In some cases, it may not be advantageous to use a method that deliberately produces a power loss, for example, with very short pulse pauses or very small power changes, but definitely from a specific threshold when the pulse pauses thus exceed a specific length or the power changes exceed a specific threshold.

Other features and advantages will be appreciated from the following description of certain embodiments, with reference to the Figures of the drawings and from the claims. The features shown in this instance are not necessarily intended to be understood to be to scale and are illustrated in such a manner that the features can be made clearly visible. The various features may be implemented individually or together in any combination.

DETAILED DESCRIPTION

Figure 1:
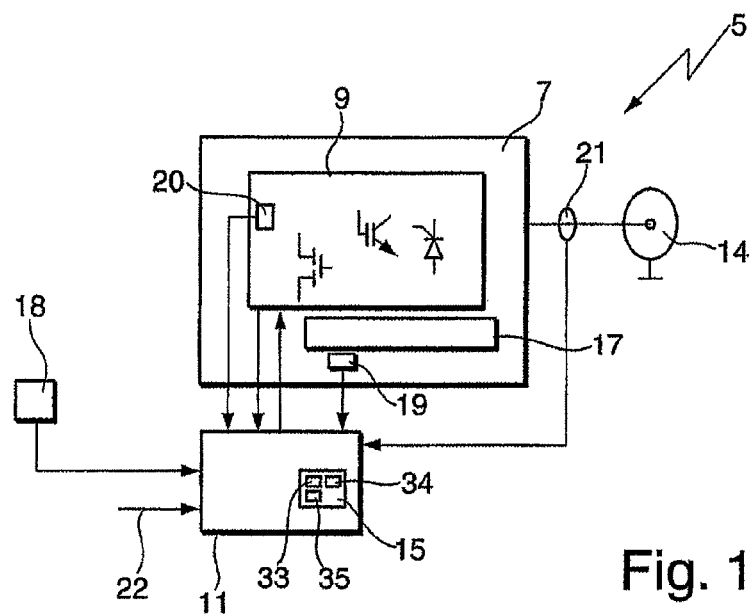
FIG. 1 shows an alternating current power production device.

FIG. 1 shows an alternating current power production device 5, which may be a high-frequency power production device. It has a power convertor unit 7, in which at least one semiconductor switching element 9 is arranged. This is indicated with three different symbols for three frequently used semiconductor switching elements (MOSFET, IGBT, SCR) and is intended to be understood in such a manner that, in this instance, all possible semiconductor switching elements, which can be connected in different manners, are included. The power convertor unit 7 may, for example, have a half bridge, or a full bridge, a class E inverter or a class D inverter. The semiconductor switching elements 9 may be cooled with a cooling device 17. This may, for example, be a cooling member with heat discharge to air or to a liquid cooling medium. The semiconductor switching elements 9 are controlled by a control circuit 11. The power produced, in this instance an alternating current power, in particular high-frequency power, is supplied to an output 14 of the alternating current power production device 5. Temperatures can be measured at various points. A first temperature sensor 18 can measure the ambient temperature inside the housing of the alternating current power production device 5, a second temperature sensor 19 can measure the temperature at the cooling device 17, a third temperature sensor 20 can measure the temperature at the semiconductor switching elements 9. The power, voltage and current can also be established, which is indicated in this instance with the measurement sensor 21. The measurement of these electrical variables can be carried out at the output 14 of the alternating current power production device 5 or at the output of a power convertor unit 7 or at one of the semiconductor switching elements 9.

The control circuit 11 has a monitoring control circuit 15 that can influence the control circuit 11 in order to produce suitable control signals for controlling the semiconductor switching elements 9. The control signals can be produced in order to influence the power loss of the semiconductor switching element(s) in a selective manner. This is carried out in such a manner that, in a first power production and output, for example, at the output 14, a first power loss $P_{V1}$ in the semiconductor switching elements 9 is converted into heat. In the case of a second power production and output that is lower compared with the first, for example, at the output 14, a second power loss $P_{V2}$ is converted into heat in the semiconductor switching elements 9, for which $P_{V2} > P_{V1}*(P_{OUT2.1}/P_{OUT1.1})$, $P_{OUT2.1}$ preferably being in the range 0 W. With such an arrangement or such a method, the at least one semiconductor switching element 9 can be protected from premature damage owing to frequent and/or high temperature changes. At the same time, such an arrangement is energy-saving since the power loss is increased only to the extent required to solve the problem. If the first power loss $P_{V1}$ can be further reduced by means of corresponding measures or devices, the control can accordingly be adapted in order to also reduce the second power loss accordingly.

A desired value 22 can be predetermined for the control circuit 11, for example, in order to control or adjust the output powers at the output 14.

The monitoring control circuit 15 may have a digital data processing device 33 having a data store 34 and program memory 35 for establishing the first power loss $P_{V1}$ from the first alternating current power $P_{OUT1.1}$.

The monitoring control circuit 15 does not have to establish the first power loss using measurement technology in order to establish the second power loss $P_{V2}$ but can instead, using the data processing device 33, data store 34 and program memory 35, rapidly and reliably establish it from a stored database and influence the control circuit 11 in order to produce control signals for the production of the second power loss $P_{V2}$.

In an elegant manner, as many tasks are transferred to the data processing device 33 in order to establish the power loss $P_{V2}$ and the necessary control signals as it can handle in terms of calculation complexity within the predetermined time. It can also take over the storage, loading, and processing of data established in the calibration process or during operation. The speed with which the power loss must be readjusted is dependent inter alia on the size of the components, the temperature conductivity and the cooling. With the components that are generally used in the power range of greater than 1 kW, a reaction time of from 100 µs to 100 ms is sufficient to protect the components from damage. For these tasks it is consequently possible to use a data processing device with moderate speed or a data processing device that also takes on other control tasks.

Figure 2:
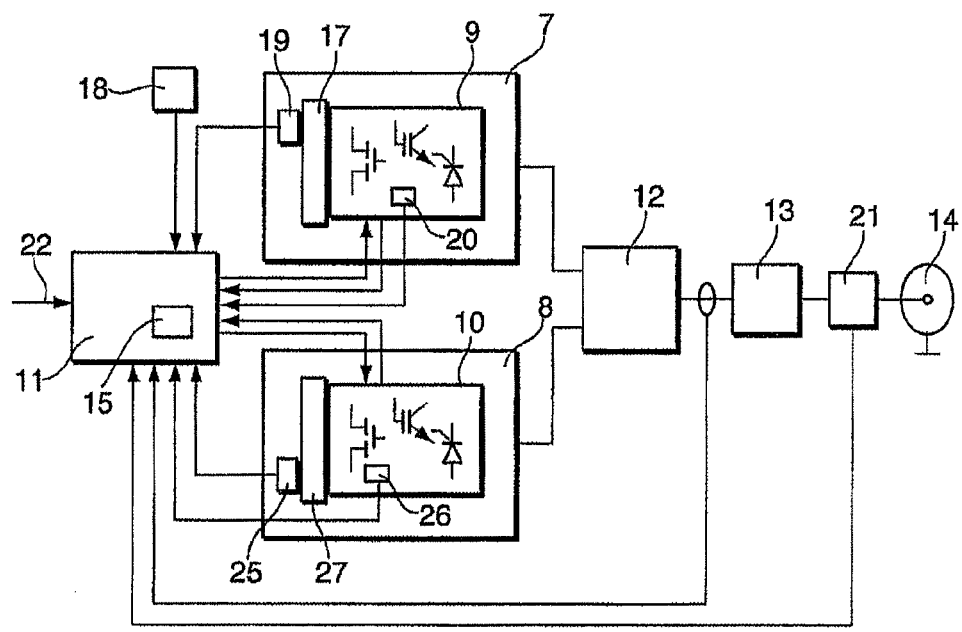
FIG. 2 shows an alternating current power production device having two power convertor units.

FIG. 2 shows an alternating current power production device 5 that has two power convertor units 7, 8. The second power convertor unit 8 also has at least one semiconductor switching element 10, a cooling device 27 and temperature sensors 25, 26. The power convertor unit 8 may also have, for example, a half bridge or a full bridge, a class E inverter or a class D inverter. The output powers of the power convertor units 7, 8 are supplied to a power coupler 12. This power coupler 12 may, for example, be a power coupler (transmission line coupler), a Wilkinson coupler or a 90° hybrid coupler, for example, a 3 dB coupler. However, other techniques of coupling both powers can also be used. A 90° hybrid coupler has the advantage that it couples two input signals based on the phase position of the two input signals and supplies two different outputs in a phase-dependent manner. It is thus possible, by changing the phase position of the output signals of the two power convertors 7, 8 (corresponding to input signals of the coupler 12), to keep the power loss in the semiconductor switching elements 9, 10 for various output powers at an output of the coupler almost constant, by constant output and power losses being produced by the semiconductor switching elements 9, 10, but with the phase position being changed, in order to produce different powers at the (power) output of the coupler 12. The power supplied to the other output of the coupler 12 can be converted into direct current power and the alternating current power production device 5 can be provided again as an input power. A compilation circuit 13 may also be connected to the power coupler 12. This may, for example, be an impedance transformation device or a filter or an overvoltage protection device. Furthermore, another measurement device 21, for example, a directional coupler, may be provided. This can be used to establish the output power at the output 14, for example, forward and backward power, or to establish the current, voltage and phase between current and voltage and consequently to establish the impedance at the output 14. A measurement of the voltage and/or current can also be carried out inside the power convertor units 7, 8, in particular at the semiconductor switching elements 9, 10. The measurement signals produced can be supplied to the control circuit 11.

The semiconductor switching elements 9, 10 of the power convertor units 7, 8 can be suitable to be brought for a predeterminable period of time into a partially conductive state. Using such a device, the semiconductor switching elements can be brought in a simple and precise manner by the control circuit to a desired power loss level, even when the resistance of the partially conductive state cannot be adjusted in a simple manner. In order to produce heat losses that are distributed in a uniform manner over time, the semiconductor switching elements can be brought several times for a short period of time into the partially conductive state. Data relating to this can be stored in the data store 34 of the monitoring control circuit 15.

The semiconductor switching elements 9, 10 of the power convertor units 7, 8 can be suitable to be brought into a partially conductive state in which they have a resistance $R_v$, which can be predetermined by the control 11. Using such a device, the semiconductor switching elements can be brought by the control circuit to a desired power loss level in a simple and precise manner, even when the duration of the partially conductive state cannot be adjusted in a simple manner. Data relating to this can be stored in the data store 34 of the monitoring control circuit 15.

The semiconductor switching elements 9, 10 of the power convertor units 7, 8 can be suitable to be brought from a blocking state into a state in which they continue to have blocking properties and at the same time power loss is converted into heat. This is technically possible since many semiconductor switching elements 9, 10 require a degree of time for redistribution of internal charge carriers when being controlled from a blocking state into a conductive state. During this time, they remain in the blocking state. However, the redistribution of the charge carriers produces a power loss in the semiconductor switching elements 9, 10. Using such a device, the semiconductor switching elements 9, 10 can be brought by the control circuit to a desired power loss level in a simple and precise manner. Data relating to these properties can be stored in the data store 34 of the monitoring control circuit 15.

The semiconductor switching elements 9, 10 of the power convertor units 7, 8 can be suitable to be brought from a conductive state into a state in which they continue to have conductive properties and at the same time power loss is converted into heat. This is technically possible since many semiconductor switching elements 9, 10 require a degree of time for redistribution of internal charge carriers when being controlled from a conductive into a blocking state. During this time, they remain in the conductive state. However, the redistribution of the charge carriers produces a power loss in the semiconductor switching elements 9, 10. Using such a device, the semiconductor switching elements 9, 10 can be brought by the control circuit to a desired power loss level in a simple and precise manner. Data relating to these properties can be stored in the data store 34 of the monitoring control circuit 15.

The semiconductor switching elements 9, 10 of the power convertor units 7, 8 can be movable for at least a period of time $\Delta T_{on}$ into a conductive state that is shorter than a quarter of the period duration of the frequency produced by the alternating current power production device. Using such a device, the semiconductor switching elements 9, 10 can be brought by the control circuit to a desired power loss level in a simple and precise manner. Data relating to this can be stored in the data store 34 of the monitoring control circuit 15.

Figure 3:
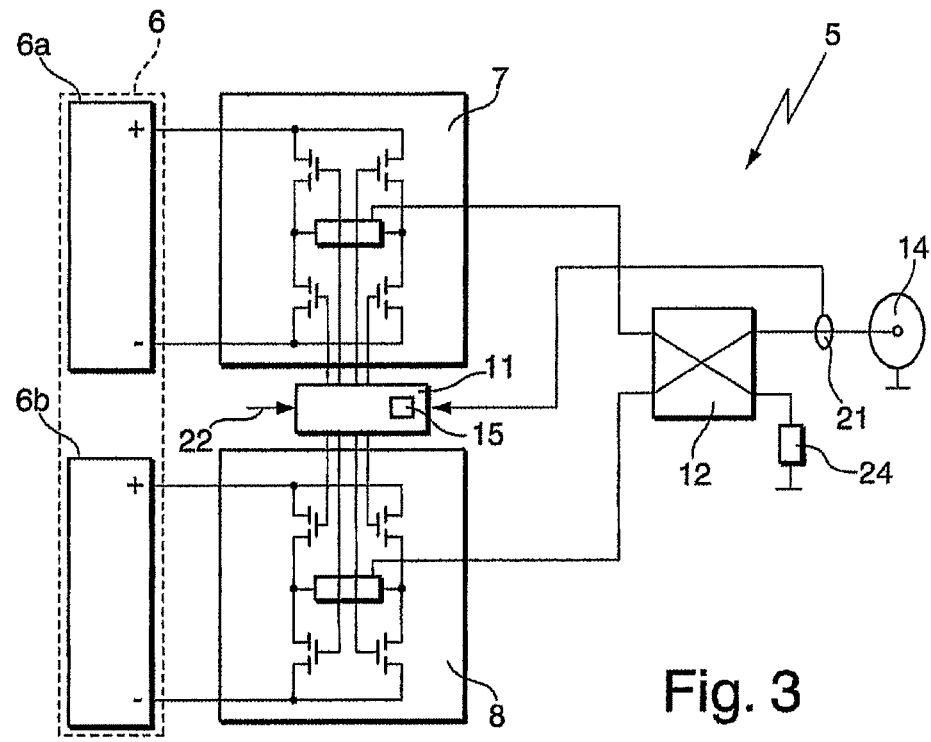
FIG. 3 shows an alternating current power production device having two full bridge power convertor units and a 3 dB 90° hybrid coupler.

FIG. 3 shows an alternating current power production device 5, in this instance a high frequency power production device having two power convertor units 7, 8 that are each constructed as full bridges. The elements that correspond to the elements already described above have been given the same reference numerals and are not explained again. The power coupler 12 is a 3 dB 90° hybrid coupler and a compensation resistor 24 is connected to a second output thereof. In addition, direct current supply devices 6a, 6b, which are part of the alternating current power production device 5, are also shown in this instance. These can naturally also be combined to form a common direct current supply device 6 that supplies both power convertor units 7, 8. They may also be located outside the alternating current power production device 5.

Figure 4:
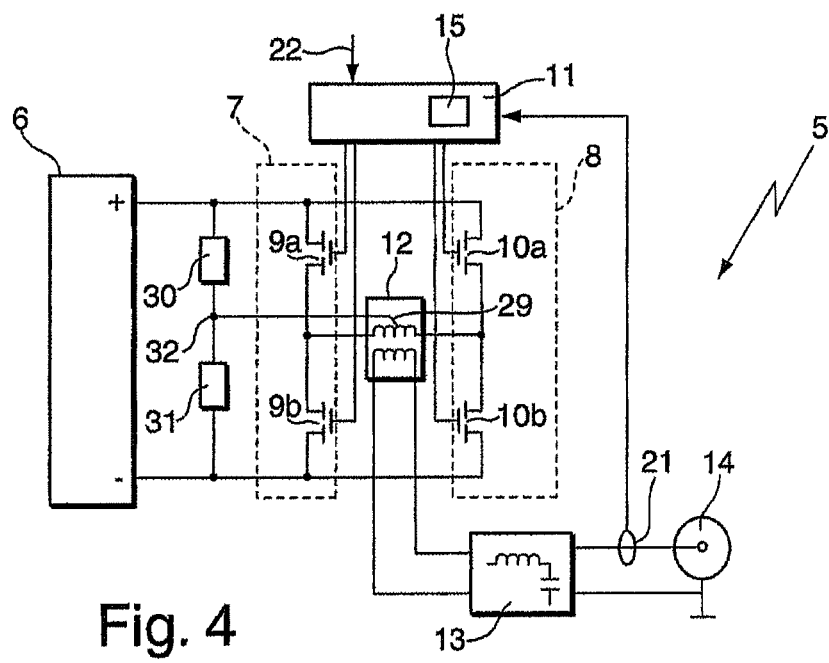
FIG. 4 shows an alternating current power production device having two half bridges.

FIG. 4 shows another alternating current power production device 5, in this instance also a high frequency power production device having two power convertor units 7, 8 that are each constructed as half bridges. The elements that correspond to the elements already described above have been given the same reference numerals and are not explained again. The power coupler 12 is configured as a transformer arrangement with a coupling inductance and a centre tapping 29. The centre tapping 29 is connected to a connection point 32 between two compensation elements 30, 31, which are connected to the direct current supply 6. In this instance, it is also possible to change the output power by changing the control procedure in the two power convertor units 7, 8 and, at the same time, the power loss in the semiconductor switching elements 9a, 9b, 10a, 10b can be controlled. A change of the phase of the control signals of the semiconductor switching elements 9a, 9b with respect to the phase of the control signals of the semiconductor switching elements 10a, 10b thus brings about a change of the output power at the output 14. If a high power level is intended to reach the output 14, the semiconductor switching elements are controlled in such a manner that the current flow is carried out in an alternating manner via the semiconductor switching elements 9a, 10b and subsequently via 9b, 10a. If a lower power level is intended to reach the output 14, the phase of the control is changed so that the current flow is carried out in a cyclical manner via the semiconductor switching elements 9a, 10b and subsequently via 9a, 10a, subsequently via 9b, 10a and subsequently via 9b, 10b and then again via 9a, 10b. This control procedure referred to as a phase shift method can in this instance preferably be used to control the power loss in the semiconductor switching elements 9a, 9b, 10a, 10b with appropriate sizing of the power coupler 12 and the compensation elements 30, 31 together with the control signals. A current flow through the semiconductor switching elements 9a, 10a and 9b, 10b must be maintained in order to produce power loss, even when the current flows through 9a, 10a or 9b, 10b, respectively. Without the compensation elements 30, 31, the current in the inductance contained in the power coupler 12 would decline rapidly and it would not be possible to control the power loss in the semiconductor switching elements 9a, 10a and 9b, 10b. The current flow can be maintained by the connection of the power coupler 12 to the compensation elements 30, 31. The compensation elements 30, 31 may, for example, be specially sized capacitors, and there is then at least in theory no power loss produced therein, which has a positive effect on the energy consumption.

Figure 5A:
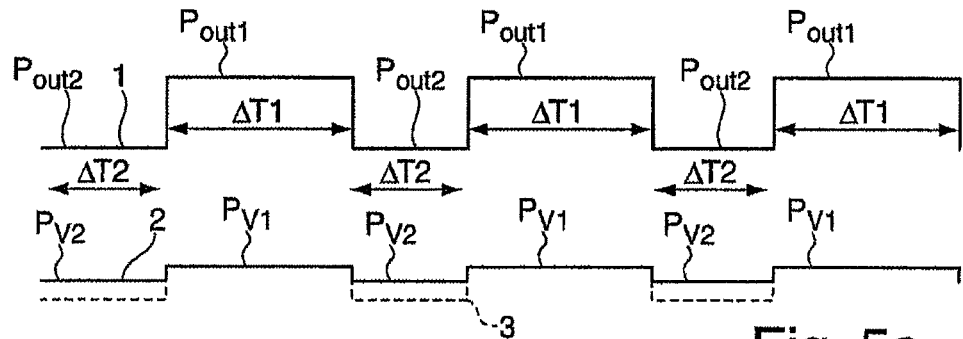
FIG. 5a is a schematic illustration of the power curves in pulse operation.
Figure 5B:
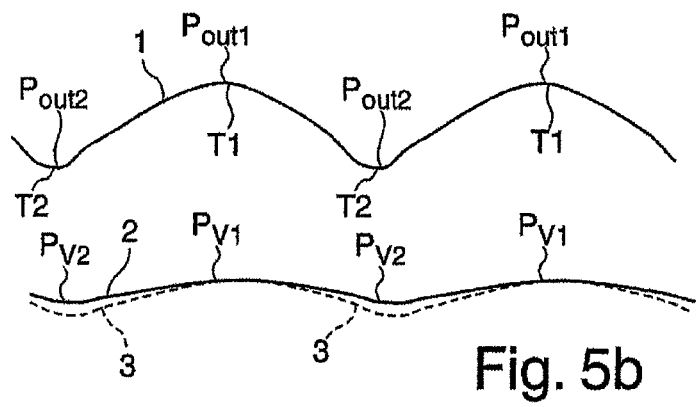
FIG. 5b is a schematic illustration of the power curves in modulation operation.

FIGS. 5a and 5b show typical progressions in time for the production of alternating current power and power loss. The upper signal curve 1 in each case schematically shows the value of an alternating current power signal averaged over the alternating current frequency, as can be measured at the output of a power convertor unit 7, 8 or at the output of an alternating current power production device 5. During a power output time period $\Delta T_1$, a first (alternating current) power $P_{OUT1}$ is produced, during a pulse pause time period $\Delta T_2$, a second (alternating current) power $P_{OUT2}$ or no power is produced, $P_{OUT1}$ being greater than $P_{OUT2}$. At the same time in the at least one semiconductor switching element, a first power loss $PV_1$ is produced during the power output time period $\Delta T_1$, and a second power loss $P_{V2}$ during the pulse pause time period $\Delta T_2$, which can be seen in the lower curve in each case in the signal curves 2 and 3. The signal curve 2 schematically shows how the power loss signal may extend during operation of the alternating current power production device 5 in a device and method according to this description. The signal curve 3, drawn with broken lines, schematically shows how the power loss signal would extend according to conventional methods.

Figure 6:
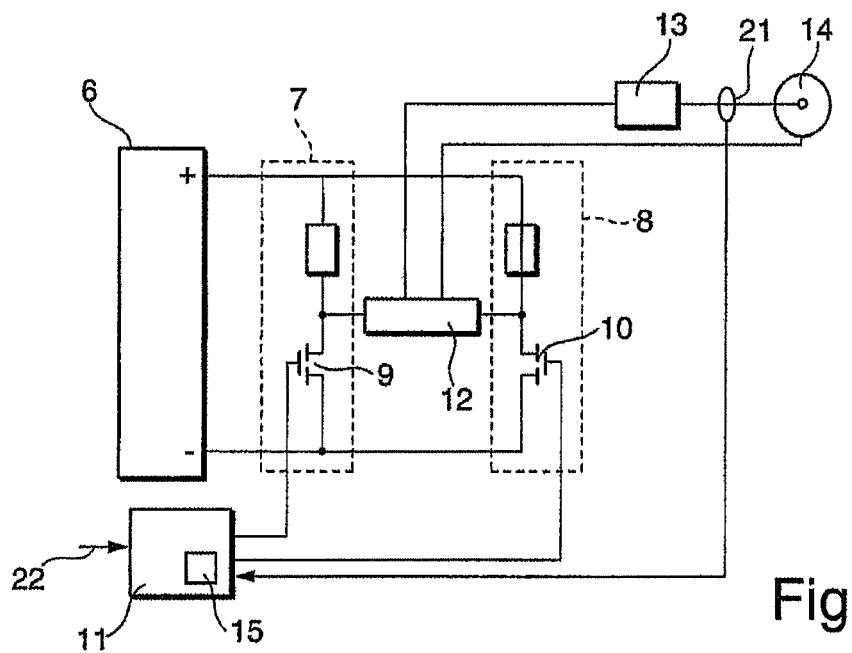
FIG. 6 is an alternating current power production device having two class E inverters.
Figure 7A:
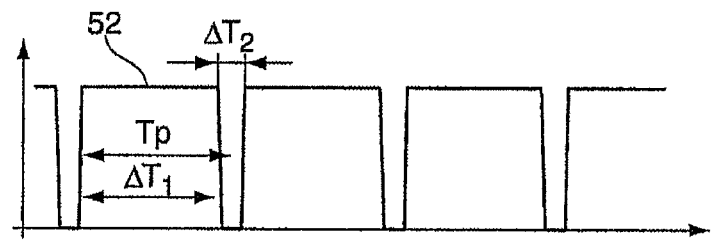
FIGS. 7a, b and 8a, b show progression in time for the production of alternating current power in a pulsed power output operation.
Figure 7B:
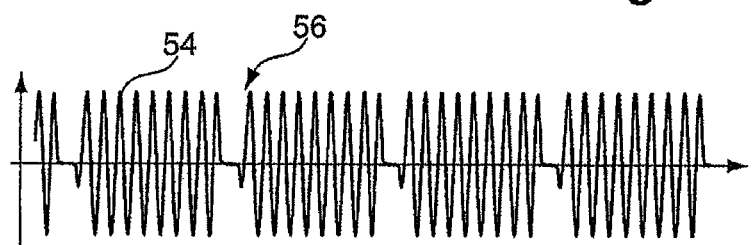

FIG. 6 shows another alternating current power production device 5 having two power convertor units 7, 8 that are each constructed as class E inverters. The elements that correspond to the elements already described above have been given the same reference numerals and are not explained again. Class E inverters simplify the control circuit 11 since all control signals are in relation to the earth.

Figure 8A:
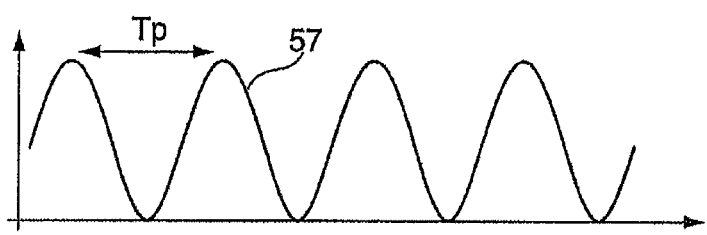
Figure 8B:
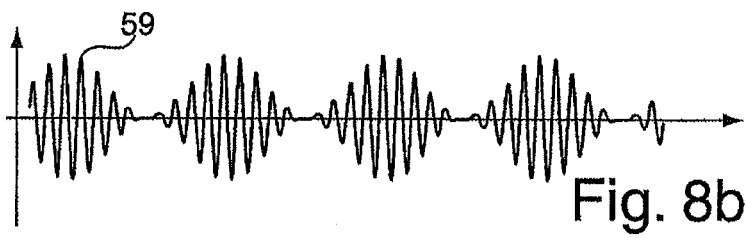

FIGS. 7a and 7b and FIGS. 8a, 8b show typical progressions in time for production of alternating current power. The respective upper signal curve 52 in FIG. 7a and 57 in FIG. 8a schematically shows the value of an alternating current power signal averaged over the alternating current frequency, respectively, as can be measured at the output of a power convertor unit 7, 8 or at the output of an alternating current power production device 5. The respective lower signal curve 54 in FIG. 7b and 59 in FIG. 8b schematically shows the alternating current power, which changes periodically in the embodiment with a frequency fp and period duration Tp=1/fp, with the fundamental frequency fn, which is higher than the pulse period duration Tp=1/fp, respectively. The fundamental frequency in this instance is predetermined by the industrial process to be supplied with alternating current power. High-frequency applications, such as the excitation of industrial plasmas or gas lasers or the supply of induction heating processes operate at a frequency that is predetermined by the user in accordance with the process. The frequency fp may also be predetermined by the process. A first alternating current power $P_{OUT1.1}$ can be produced during a power output time period $\Delta T_1$ and a second or no alternating current power $P_{OUT2.1}$ can be produced during a pulse pause time period $\Delta T_2$ 56. In each of the two time periods, a power loss $P_v$ is produced. Processes are also conceivable in which Tp is not constant but the power output time periods $\Delta T_1$ and pulse pause time periods $\Delta T_2$ simply alternate. The output power $P_{OUT}$ is also not necessarily an alternating current power, but may also be a direct current power.

A number of embodiments of the invention have been described. Nevertheless, it will be understood that various modifications may be made without departing from the spirit and scope of the invention.

What is claimed is:

1. A method for operating a plasma installation, an induction heating installation, or a laser excitation installation in a pulsed power output operation, the method comprising:
producing and discharging, by at least one semiconductor switching element of a power generator for supplying power to a plasma process, an induction heating process, or a laser excitation process, a first power $P_{OUT1.1}$ during a power output time period $\Delta T_1$ in a power output operation, the first power $P_{OUT1.1}$ being discharged at a power output of the power generator, wherein a first power loss $P_{V1}$ is produced in the at least one semiconductor switching element during the power output time period $\Delta T_1$ at the same time as the first power $P_{OUT1.1}$ is being produced;
controlling the at least one semiconductor switching element to produce a second power loss $P_{V2}$ in the at least one semiconductor switching element during a pulse pause time period $\Delta T_2$ in a pulse pause operation during which no power $P_{OUT2.1}$ suitable for the ignition or the operation of the plasma process, the induction heating process, or the laser excitation process is produced at the power output of the power generator by the at least one semiconductor switching element of the power generator; and
continuously alternating the power output operation and the pulse pause operation;
wherein the produced power losses $P_{V1}$, $P_{V2}$ are converted into heat, and a reduction of a temperature of the at least one semiconductor switching element by more than a predetermined value is prevented by the controlling of the at least one semiconductor switching element.

2. The method of claim 1, wherein the power output time period and the pulse pause time period alternate with a frequency fp predetermined by the plasma installation, induction heating installation, or laser excitation installation.

3. The method of claim 2, further comprising producing an alternating current power at a frequency fn>fp during the power output time period.

4. The method of claim 2, wherein fp is in the range from 0.01 Hz to 50 kHz.

5. The method of claim 1, further comprising determining the first power loss $P_{V1}$ from a predetermined or a measured value for the first power $P_{OUT1.1}$, determining the second power loss $P_{V2}$ to be adjusted based on the established first power loss $P_{V1}$, and controlling the at least one semiconductor switching element to produce the second power loss $P_{V2}$.

6. The method of claim 1, further comprising determining the first power loss $P_{V1}$ by reading a value associated with the power $P_{OUT1.1}$ from a data store.

7. The method of claim 1, further comprising adjusting the second power loss $P_{V2}$ based on one or more of:
a duration of the power output time period $\Delta T_1$,
a duration of the pulse pause time period $\Delta T_2$,
progress in time of $P_{OUT1.1}$, $P_{OUT2.1}$, or the power supplied by the power generator,
progress in time of the power loss in the at least one semiconductor switching element,
an established temperature or a temperature curve,
an established voltage value or voltage curve,
an established current value or current curve,
a time derivative of the curve of $P_{OUT1.1}$, $P_{OUT2.1}$, or the power supplied by the power generator, the power loss in the at least one semiconductor switching element, the temperature curve, the voltage curve, or the current curve.

8. The method of claim 1, wherein the second power loss $P_{V2}$ is the same size as the first power loss $P_{V1}$.

9. The method of claim 1, further comprising:
controlling the at least one semiconductor switching element during the power output time period $\Delta T_1$ to alternate between a conductive state, in which it has a switching resistance $R_{on}$, and a blocking state, in which it has a blocking resistance $R_{off}$; and
switching the at least one semiconductor switching element, during the pulse pause time period $\Delta T_2$, at least temporarily into a partially conductive state in which the at least one semiconductor switching element has a transition resistance $R_V$, the resistances being given by: $R_{on} < R_V$ and $R_V < R_{off}$.

10. The method of claim 1, further comprising controlling the at least one semiconductor switching element during the pulse pause time period $\Delta T_2$ such that the second power $P_{OUT2.1}$ is equal to zero and the first power loss $P_{V1}$ and the second power loss $P_{V2}$ differ by no more than a factor of two.

11. The method of claim 1, further comprising:
controlling the at least one semiconductor switching element during the power output time period $\Delta T_1$ to obtain a switching-on time range $\Delta T_{on1}$ when transitioning to a conductive state and a switching-off time range $\Delta T_{off1}$ when transitioning to a blocking state; and
controlling the at least one semiconductor switching element during the pulse pause time period $\Delta T_2$ to obtain a switching-on time range $\Delta T_{on2}$ when transitioning to a conductive state and a switching-off time range $\Delta T_{off2}$ when transitioning to a blocking state;
wherein $\Delta T_{on2}$ is smaller than $\Delta T_{on1}$.

12. The method of claim 1, further comprising producing an additional power $P_{OUT1.2}$ during the power output time period $\Delta T_1$ and producing an additional power $P_{OUT2.2}$ during the pulse pause time period $\Delta T_2$ by controlling at least one additional semiconductor switching element.

13. The method of claim 12, further comprising controlling the at least one semiconductor switching element and the at least one additional semiconductor switching element in accordance with respective control procedures, wherein the control procedures differ.

14. The method of claim 12, further comprising controlling the at least one semiconductor switching element and the at least one additional semiconductor switching element in accordance with a first control procedure when producing the power POUT1.1 and POUT1.2 and in accordance with a second control procedure when producing the power $P_{OUT2.1}$ and $P_{OUT2.2}$, the first and second control procedures differing.

15. The method of claim 12, further comprising:
adjusting a first phase relationship between the first power $P_{OUT1.1}$ and the first additional power $P_{OUT1.2}$; and
adjusting a second phase relationship between the second power $P_{OUT2.1}$ and the second additional power $P_{OUT2.2}$;
wherein the first phase relationship and the second phase relationship differ.

16. The method of claim 1, further comprising detecting, by a measurement device, a power related to the first power $P_{OUT1.1}$ and adjusting the power to a desired value.

17. A method for producing power comprising:
determining one or more characteristics including:
- a duration of a power output time period $\Delta T_1$,
- a duration of a pulse pause time period $\Delta T_2$,
- progression in time of a power $P_{OUT1.1}$, $P_{OUT2.1}$, or a power supplied by a power generator,
- progression in time of a power loss in a semiconductor switching element of the power generator,
- an established temperature or a temperature curve,
- an established voltage value or voltage curve,
- an established current value or current curve, and
- a time derivative of the curve of $P_{OUT1.1}$, $P_{OUT2.1}$, or the power supplied by the power generator, the power loss in the semiconductor switching element, the temperature curve, the voltage curve, or the current curve;

assessing whether a power loss should deliberately be produced based on the one or more characteristics; and
producing power in accordance with the assessment;
wherein $P_{OUT1.1}$ corresponds to a first power produced during the power output time period $\Delta T_1$, and $P_{OUT2.1}$ corresponds to a second power produced during a pulse pause time period $\Delta T_2$, wherein $P_{OUT2.1}$ is not suitable for ignition or operation of a plasma process, an induction heating process, or a laser excitation process.

* * * * *

UNITED STATES PATENT AND TRADEMARK OFFICE
CERTIFICATE OF CORRECTION

PATENT NO. : 8,456,220 B2
APPLICATION NO. : 13/524864
DATED : June 4, 2013
INVENTOR(S) : Christian Thome et al.

It is certified that error appears in the above-identified patent and that said Letters Patent is hereby corrected as shown below:

In the Claims

Column 14, line 55 (Claim 14, line 55) delete "POUT1.1 and POUT1.2" and insert --$P_{OUT1.1}$ and $P_{OUT1.2}$--.

Signed and Sealed this
Twenty-fourth Day of September, 2013

Teresa Stanek Rea
*Deputy Director of the United States Patent and Trademark Office*